United States Patent [19]
Chomette et al.

[11] Patent Number: 5,235,496
[45] Date of Patent: Aug. 10, 1993

[54] DEVICE FOR PACKAGING INTEGRATED CIRCUITS

[75] Inventors: Michel Chomette, La Colle Sur Loup; Robert J. Mathews, St. Laurent du Var, both of France

[73] Assignee: Texas Instruments Incorporated, Dallas, Tex.

[21] Appl. No.: 868,910

[22] Filed: Apr. 15, 1992

[30] Foreign Application Priority Data

Apr. 18, 1991 [FR] France .................. 91 04810

[51] Int. Cl.$^5$ .................................. H05K 1/18
[52] U.S. Cl. ........................ 361/764; 361/784; 361/785; 174/52.2; 174/235; 257/750; 257/787
[58] Field of Search ............ 361/401, 392, 395, 397, 361/412, 413; 357/65, 55, 68, 71, 72; 174/255, 261, 262, 52.2, 52.3

[56] References Cited
U.S. PATENT DOCUMENTS 5,018,051  5/1991  Yamada et al. ............... 361/393
5,031,069  7/1991  Anderson ..................... 361/321
5,150,280  9/1992  Arai et al. .................... 361/401

Primary Examiner—Leo P. Picard
Assistant Examiner—Young S. Whang
Attorney, Agent, or Firm—William E. Hiller; Richard Donaldson; Jay M. Cantor

[57] ABSTRACT

The device comprises at least one printed circuit board (11,12) on which is fixed a heightening board (15) comprising at least one opening (16) for forming with the surface of the printed circuit board (12) located in facing relation to the opening, the bottom and the lateral walls of a cavity (17) for at least one integrated circuit (18) connected with the printed circuit carried by the board defining the bottom of the cavity by means of conductive wires (19). The cavity containing the integrated circuit is filled with a resin (22) completely covering the integrated circuit. The printed circuit board (11,12) is cut on its periphery along a line of through holes (23) provided with a metal coating (24) and connected to printed conductors of the board, metallized grooves (23,24) resulting from the cutting constituting connection terminals of the device.

4 Claims, 2 Drawing Sheets

DEVICE FOR PACKAGING INTEGRATED CIRCUITS

BACKGROUND OF THE INVENTION

The present invention relates to the packaging of integrated circuits and concerns more particularly the packaging of such circuits on printed circuit boards.

Integrated circuits are generally in the form of chips provided with input and output connection terminals in the form of pins.

These chips are placed in packaging and connection housings comprising on their sides groups of metal strips or tabs ensuring the electrical connection between the input and output terminals of the chip and the printed circuit board on which the integrated circuit is to be mounted.

Packaging housings which ensure the adaptation between the integrated circuit and the printed circuit board are expensive.

Moreover, an integrated circuit packaged in its housing has a large overall size which is not readily compatible with the tendency to construct circuits that are as compact as possible.

SUMMARY OF THE INVENTION

An object of the invention is to overcome the drawbacks of the packaging means for known integrated circuits by providing a packaging device which combines low cost price with a small overall size, particularly when interconnecting a plurality of integrated circuits, and with stronger peripheral connections.

The invention therefore provides a device for packaging integrated circuits, characterized in that it comprises at least one printed circuit board on which is fixed a heightening board comprising at least one opening for forming with the surface of the printed circuit board located in facing relation to the opening, the bottom and the side walls of a cavity for at least one integrated circuit connected to the printed circuit carried by the board defining the bottom of the cavity, by means of conductive wires, the cavity containing the integrated circuit being filled with a resin which completely covers the integrated circuit, said printed circuit board is cut on its periphery along a line of through holes provided with a metal coating and connected to printed conductors of the board, the metallized grooves resulting from said cutting constituting terminals for the connection of the device.

BRIEF DESCRIPTION OF THE DRAWINGS

A better understanding of the invention will be had from the following description which is given solely as an example with reference to the accompanying drawings in which.

DESCRIPTION OF THE INVENTION

Reference will first of all be made to FIGS. 1 to 4 which show the various stages of the fabrication of a device for packaging integrated circuits according to the invention.

Figure 1:
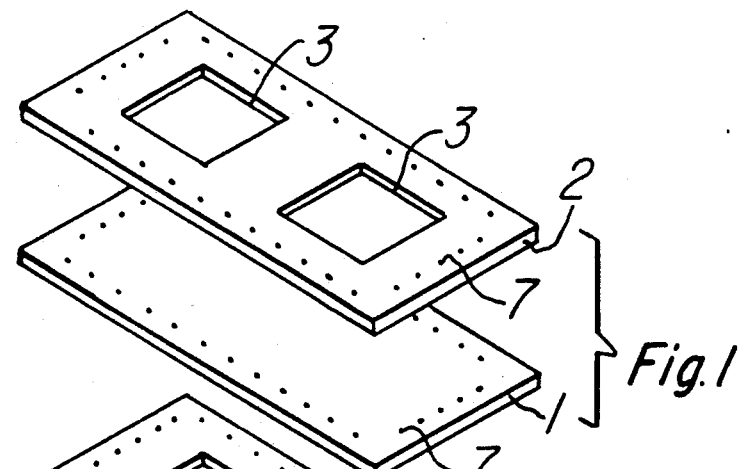
FIGS. 1 to 4 are diagrammatic perspective views of various stages of the formation of a device for packaging integrated circuits according to the invention.

As shown in FIG. 1, a rectangular board 1 of epoxy resin is first of all assembled with a board 2 of the same type provided with openings 3 for receiving integrated circuit chips.

In the envisaged embodiment, the board 1 defining with the openings 3 of the board 2 cavities 4 for the integrated circuits has a thickness of 0.6 mm.

The board 2 has a thickness of 1.2 mm.

The boards 1 and 2 are assembled for example by adhesion.

The board 1 is a printed circuit board whose conductors for ensuring the connection between the integrated circuits and the exterior are not shown.

Figure 2:
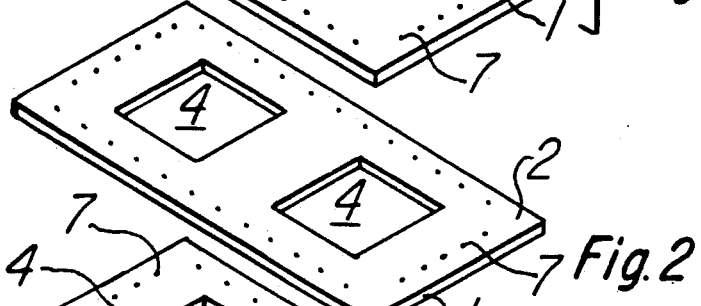

FIG. 2 shows the structure for receiving integrated circuits resulting from the assembly of the two boards 1 and 2 of FIG. 1.

It concerns a structure having two cavities 4 each of which is intended for an integrated circuit.

Figure 3:
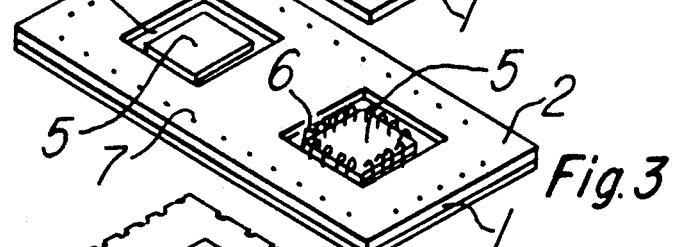

FIG. 3 shows the structure of FIG. 2 in one of the cavities 4 of which is placed an unconnected integrated circuit 5 whereas in the other cavity is placed an integrated circuit 5 connected to the lower board 1 by conductive wires 6.

Provided on the periphery of the structure of FIG. 3 are through holes 7 which are evenly spaced apart and each lead to a conductor of the printed circuit (not shown) carried by the board 1.

These holes 7 already exist in the boards 1 and 2 before their assembly.

Figure 4:
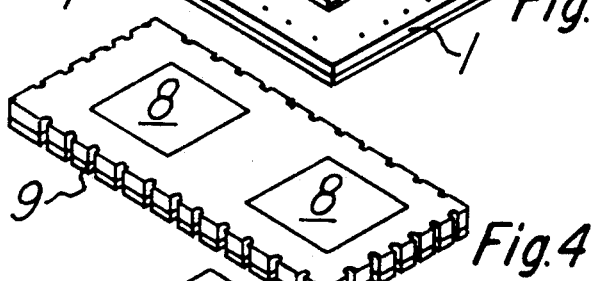

FIG. 4 shows the finished packaging device according to the invention.

It can be seen that the cavities containing the integrated circuits have been filled with a layer of resin 8.

Further, the through holes 7 have been provided with a conductive coating which will be described hereinafter and the composite structure has been cut along a perimeter defined by the lines of holes 7 so as to reveal connecting terminals 9 for connecting the structure with the exterior, arranged along the periphery of the structure.

Figure 5:
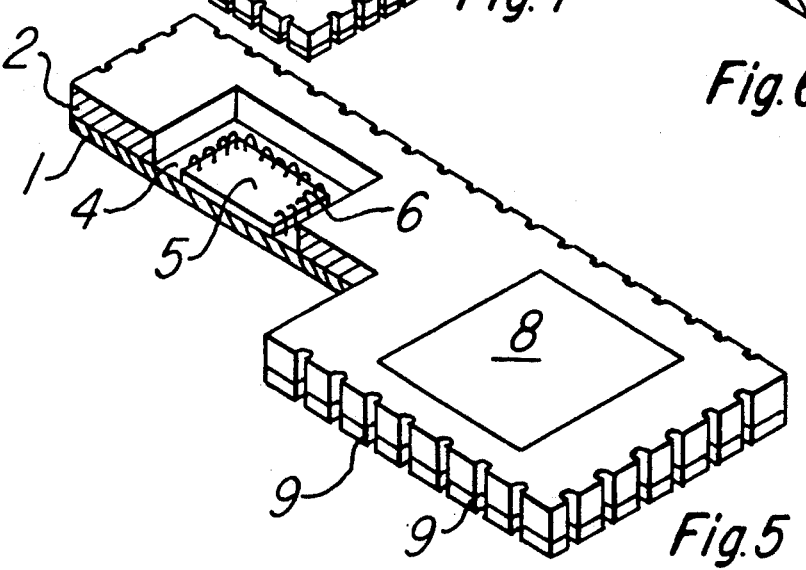
FIG. 5 is a diagrammatic perspective view, to a larger scale and partly in section, of a packaging device according to the invention.

The perspective view of FIG. 5 shows more clearly the various features of the packaging device according to the invention.

In this Figure, the portion of the device containing the left integrated circuit 5 has been cut away so as to show the superposition of the various layers formed by the boards 1 and 2 and, inside the cavity 4, by the integrated circuit 5.

Also shown are the bent conductors 6 connecting the integrated circuit 5 with the lower board 1 whose side remote from the board 2 constitutes the side on which is achieved the connection between the conductors and the printed circuit it carries, for example by the addition of flat brazing paste.

In the right part of FIG. 5, it can be seen that the cavity 4 containing the right integrated circuit is filled with an insulating resin 8.

Figure 6:
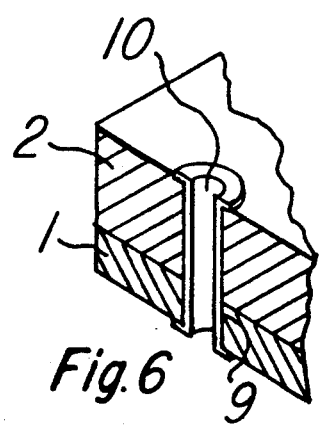
FIG. 6 is a partial perspective view of a detail of the device of FIG. 5.

The edge of the structure is defined by a series of conductive terminals 9 each of which results, as shown in more detail in FIG. 6, from the formation in each of the through holes 7 of a metal coating 10 and from the cutting of the structure along lines defined by the holes 7 provided with their conductive coating, the half of the coating which remains on the structure forming on one hand an input or output terminal of the device and ensuring on the other hand the interconnection between the printed circuits carried by the different sides of the boards of the structure.

Figure 7:
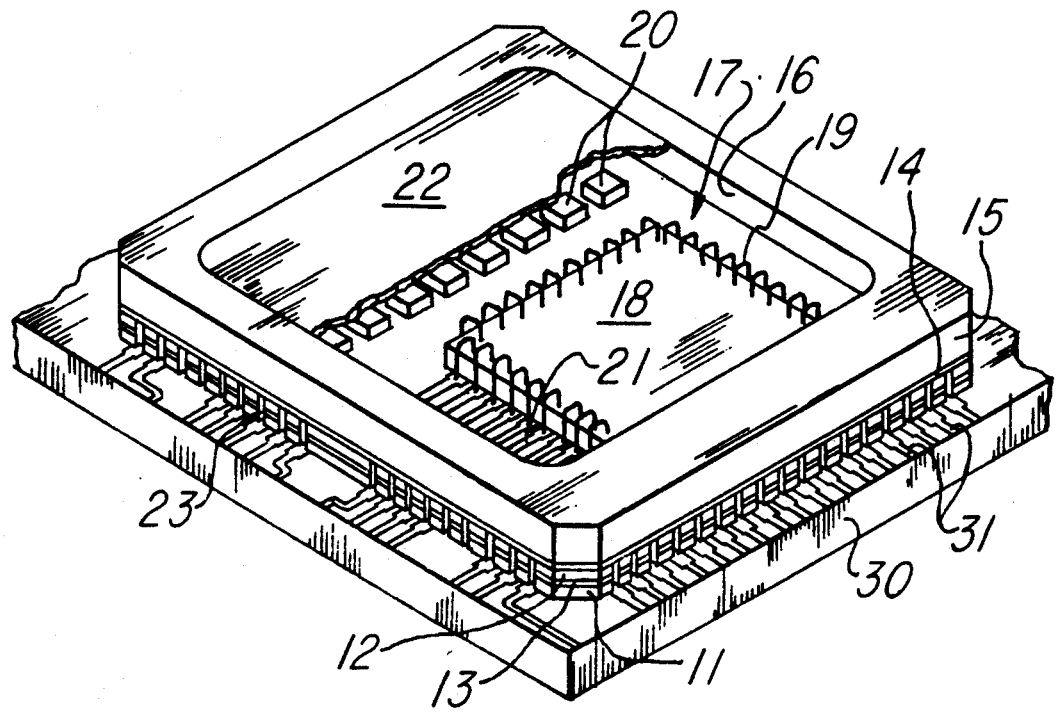
FIG. 7 is a perspective view, with a part cut away, of a packaging device according to the invention ensuring the interconnection of two integrated circuits.
Figure 8:
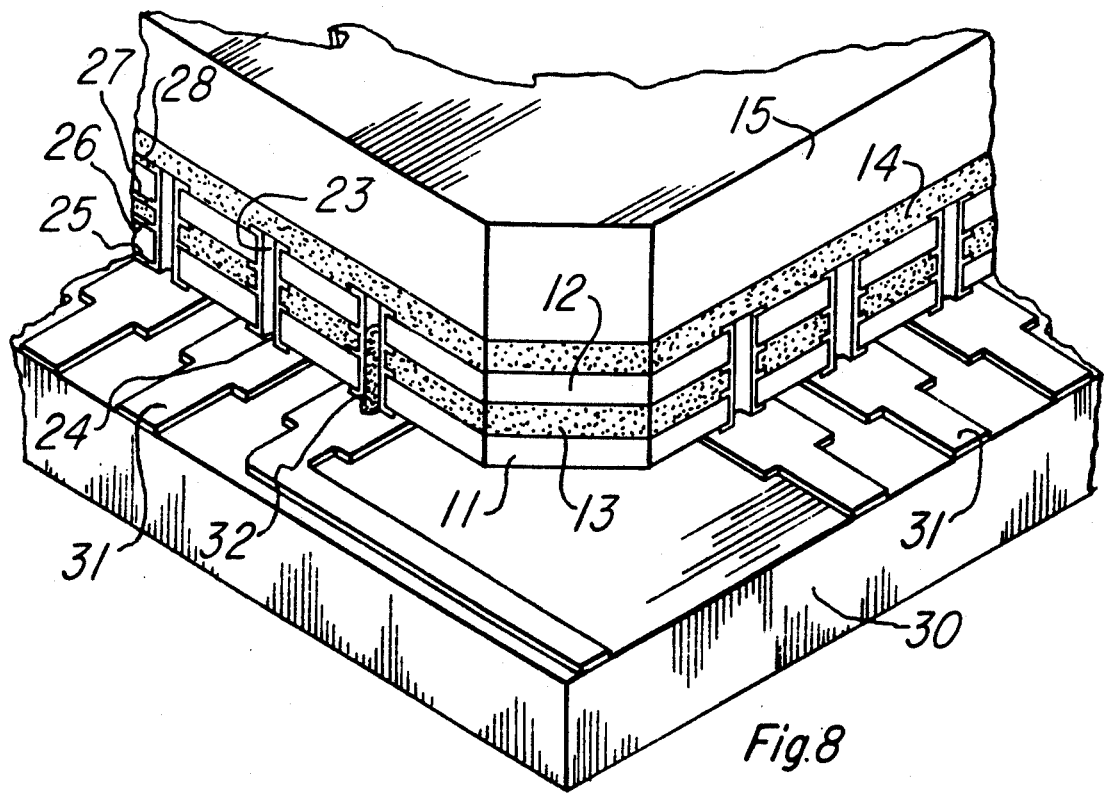
FIG. 8 is a view, to an enlarged scale, of a detail of the device of FIG. 7.

Reference will now be made to FIGS. 7 and 8 which show a device for packaging integrated circuits according to the invention, constructed in the form of a multilayer printed circuit.

The packaging device proper comprises two printed circuit boards 11 and 12 assembled by pressing together with a layer of adhesive 13. Fixed on the structure formed by the two boards 11 and 12 with interposition of a layer of pressing adhesive 14, is an upper board 15 or heightening board in which a rectangular opening 16 is provided.

The printed circuit board 12 constitutes the bottom of a cavity 17 for integrated circuits, while the periphery of the opening 16 forms the side wall of this cavity in which are disposed two integrated circuits, such as the circuit 18 connected to the subjacent printed circuit boards 11, 12 by conductive wires 19.

In the presently-described embodiment, the cavity 17 is common to two integrated circuits between which are moreover disposed discrete components, such as for example capacitors 20.

Shown on the bottom of the cavity 17 on the right are conductors 21 of the printed circuit board 12 with which are connected wires 19 connecting the integrated circuit 18 with the rest of the device.

The cavity 17 is filled with an epoxy resin 22 which is flush with the upper surface of the heightening board 15 and in which are embedded the integrated and discrete components of the device.

The thickness of the heightening board 15 is sufficient to ensure that the components disposed therein are completely covered by the layer of resin 22 and are mechanically and electrically protected by the latter.

On its periphery, the composite structure formed by the printed circuit boards 11 and 12 and the layers of adhesive 13 and 14, is cut by sawing along lines defined by the series of through holes 23 provided with a conductive coating 24, as shown better in FIG. 8. This provides on the edge of the structure electrically conductive grooves or channels which ensure the electrical connection between the printed circuits 25, 26, 27, 28 disposed on both sides of each of the printed circuit boards 11, 12 and also consequently with the integrated circuits and the discrete components located in the cavity 17 (FIG. 7).

The structure just described is disposed on a motherboard 30 which carries a printed circuit whose tracks 31 are connected to the packaging structure by soldering. A solder pad 32 is shown in FIG. 8 between a track 31 of the motherboard 30 and a through channel 23, 24 in which the solder has a tendency to rise.

The arrangement just described has the following advantages over known devices.

It permits reducing the area required for the interconnections owing to the use of connections between different levels constituted by metallized holes and the use of a plurality of levels of connection for the packaging of integrated circuits.

It also permits reducing to the minimum the height of the packaging module, by the control of the height of the resin covering the integrated circuit chips owing to the filling up to a predetermined height of the cavity or housing receiving the chips, by eliminating the metal connection pins, by ensuring the connection of the module on a mother-board by refusion of brazing paste deposited by screen printing between two planar contact areas.

The vertical connections of the upper conductive layers to the lower solder areas achieved on the periphery of the module by employing the technology of selective metallization of the edges or sections of the thin module also contribute to the obtainment of a compact structure.

The elimination of peripheral cut-out pins is achieved by the use of through holes which are metallized and then sawn along the periphery of the module, thereby forming input and output terminals of the assembly obtained.

What is claimed is:

1. Device for packaging integrated circuits, said device comprising at least one printed circuit board, a heightening board fixed to said printed circuit board and comprising at least one opening for forming with a surface of said printed circuit board located in facing relation to said opening, a bottom and lateral walls of a cavity, at least one integrated circuit disposed in said cavity, conductive wires connecting said integrated circuit to said printed circuit carried by said printed circuit board defining said bottom of said cavity, a resin filling said cavity so as to completely cover said integrated circuit, said printed circuit board being cut on the periphery thereof along a line of through holes therein which are provided with a metal coating and connected to printed conductors of said printed circuit board, metallized grooves resulting from said cutting constituting connection terminals of said device.

2. Device according to claim 1, comprising a plurality of superposed printed circuit boards having printed circuits interconnected selectively by grooves resulting from the cutting of through holes provided with a metal coating disposed on the periphery of said device.

3. Device according to claim 1, wherein said cavity receives a plurality of integrated circuits connected by conductor wires to said conductors of said printed circuit board defining said bottom of said cavity for said integrated circuits.

4. Device according to claim 1, combined with and received on a printed circuit mother-board having conductive tracks connected to said terminals of said device by soldering.

* * * * *